United States Patent [19]
Endo

[11] Patent Number: 5,619,051
[45] Date of Patent: Apr. 8, 1997

[54] SEMICONDUCTOR NONVOLATILE MEMORY CELL

[75] Inventor: Nobuhiro Endo, Tokyo, Japan

[73] Assignee: NEC Corporation, Tokyo, Japan

[21] Appl. No.: 493,455

[22] Filed: Jun. 23, 1995

[30] Foreign Application Priority Data

Jun. 27, 1994 [JP] Japan .................. 6-144284

[51] Int. Cl.$^6$ .................. H01L 29/788; H01L 29/792
[52] U.S. Cl. .................. 257/316; 257/324; 257/325; 257/411
[58] Field of Search .................. 257/314, 315, 257/316, 317, 318, 319, 320, 321, 322, 323, 324, 325, 326, 410, 411

[56] References Cited

U.S. PATENT DOCUMENTS

| | | | |
|---|---|---|---|
| 3,731,163 | 5/1973 | Shuskus . | |
| 4,794,565 | 12/1988 | Wu et al. | 365/185 |
| 4,888,630 | 12/1989 | Paterson . | |
| 5,300,799 | 4/1994 | Nakamura et al. | 257/295 |
| 5,304,503 | 4/1994 | Yoon et al. | 437/43 |

FOREIGN PATENT DOCUMENTS 59-58868   4/1984   Japan .

OTHER PUBLICATIONS

Y. Hisamune et al.; "A High Capacitive–Coupling Ratio (HiCR) Cell for 3 V–only 64 Mbit and Future Flash Memories"; IEDM Technical Digest (1993) pp. 19–22.

Primary Examiner—Ngân V. Ngô
Attorney, Agent, or Firm—Whitham, Curtis, Whitham & McGinn

[57] ABSTRACT

In a floating-gate type nonvolatile memory cell, the second dielectric film between the floating gate and the control gate is made very higher in relative permittivity than the first dielectric film under the floating gate such that the relation $\epsilon_2/\epsilon_1 \geq 13$ and the relation $t_2/t_1 \geq \epsilon_2/\epsilon_1$ hold, where $\epsilon$ and $t$ represent relative permittivity and film thickness, respectively and subscripts 1 and 2 represent the first and second dielectric films, respectively. Strontium titanate, barium strontium titanate or lead zirconate-titanate is suitable as the material of the second dielectric film. In the case of, e.g. barium strontium titanate film, the proportion of Sr to Ba may vary in the direction of the film thickness. The second dielectric film may be made up of two (or more) different dielectric layers. The memory cell is low in writing and erasing voltages and excellent in endurance in terms of write/erase cycles.

13 Claims, 5 Drawing Sheets

SEMICONDUCTOR NONVOLATILE MEMORY CELL

BACKGROUND OF THE INVENTION

This invention relates to a semiconductor nonvolatile memory cell of floating-gate type suitable for use in flash EEPROMs (electrically erasable programmable read only memories).

In conventional flash EEPROMs, floating-gate type transistors are used as nonvolatile memory cells. A floating gate type transistor has two gate electrodes in an overlapping arrangement. The first gate electrode is "floating" on a dielectric film formed on a principal surface of a semiconductor substrate. The second gate electrode, called a control gate electrode, lies above the floating gate electrode, and there is an inter-gate dielectric film between the two gate electrodes.

In this memory cell, writing of information charge is accomplished by injecting hot electrons which appear in the channel region of the transistor into the floating gate electrode through the dielectric film on the substrate surface. Erasing of the information charge is accomplished by ejecting electrons from the floating gate electrode into the source region or the channel region of the transistor. Information stored in the memory cell becomes logical "1" by writing and changes to logical "0" by erasing. Because of the difference of the erasing mechanism from the writing mechanism, the erasing voltage needs to be considerably higher than the writing voltage. In conventional memory cells for EEPROMs the erasing voltage is about 12 V, which is more than two times higher than the writing voltage. Meanwhile, the endurance of the conventional memory cells is at the level of $10^5$ write/erase cycles.

With an increase in the memory capacity of flash memories, there are strong demands for improved memory cells to enhance the endurance to more than $10^6$ write/erase cycles and to lower writing and erasing voltages and particularly lower the erasing voltage below 5 V.

In view of such demands, there is a proposal of a modification of a floating-gate type memory cell as shown, for example, in JP 59-58868 A. In the modified memory cell the floating gate electrode is overlaid with a multilayer dielectric film including a silicon nitride layer, and, in addition to a control gate electrode, another gate electrode (called an injection-erase gate electrode) is formed on the multilayer dielectric film so as to overlap only an end area of the floating gate electrode. In this memory cell, writing is accomplished by injecting electrons from the injection-erase gate electrode into the floating gate electrode, and erasing is accomplished by returning electrons from the floating gate electrode into the injection-erase gate electrode. That is, in both writing and erasing operations electrons pass through the multilayer dielectric film between the floating gate and the injection-erase gate.

The multilayer dielectric film between the floating gate and the injection-erase gate is made high in durability to flows of electrons with a view to enhancing the endurance of the memory cell. However, for the following reasons it is difficult to actually enhance the endurance to more than $10^6$ write/erase cycles. Since the floating gate electrode is formed of polysilicon, the gate electrode surface is microscopically rugged. Therefore, concentration of electric field is liable to occur in very narrow areas, and in such areas deterioration of the dielectric film is inevitably promoted. In the proposed memory cell the erasing voltage becomes equivalent to the writing voltage, and the writing and erasing voltage can be lowered by forming the control gate electrode and the injection-erase gate electrode such that the overlapping area of the control gate electrode and the floating gate electrode is very larger than the overlapping area of the injection-erase gate electrode and the floating gate electrode (the reason will be explained hereinafter). That is, the control gate electrode needs to cover a large area. This is unfavorable for a desired reduction in the memory cell size. By the proposed modification it is difficult to satisfy both the demand for lowering of operating voltage and the demand for reduction in the memory cell size.

SUMMARY OF THE INVENTION

It is an object of the present invention to provide a floating-gate type nonvolatile memory cell for use in flash EEPROMs, which is sufficiently low in writing and erasing voltages and sufficiently great in endurance in terms of write/erase cycles and can be reduced in size.

The invention provides a nonvolatile memory cell having a first dielectric film on a semiconductor substrate, a floating gate electrode which lies on the first dielectric film, a second dielectric film which lies on the floating gate electrode and a control gate electrode which lies on the second dielectric film. According to the invention, the first and second dielectric films are formed such that the following relations (a) and (b) hold:

$$\epsilon_2/\epsilon_1 \geq 13 \qquad (a)$$

$$t_2/t_1 \geq \epsilon_2/\epsilon_1 \qquad (b)$$

where $\epsilon_1$ is the relative permittivity (dielectric constant) of the first dielectric film, $\epsilon_2$ is the relative permittivity of the second dielectric film, $t_1$ is the thickness of the first dielectric film and $t_2$ is the thickness of the second dielectric film.

In this invention the material of the first dielectric film under the floating gate can be selected from silicon oxide, silicon nitride and silicon oxynitride, and it is optional to employ a two-layer or multilayer dielectric film.

As a high dielectric material for the second dielectric film between the control gate and the floating gate, strontium titanate (abbreviated to STO), barium strontium titanate (BST) or lead zirconate-titanate (PZT) is very suitable. It is preferable that the permittivity ratio $\epsilon_2/\epsilon_1$ is higher than 20.

The second dielectric film may be formed of a solid solution of two kinds of metal oxides such as, for example, BST which is a solid solution of barium titanate and strontium titanate, and it is an option to form the film such that the proportions of the two kinds of metal oxides vary, either continuously or stepwise, in the direction of the film thickness.

As another option, the second dielectric film may have a two-layer or multilayer structure using two kinds of dielectric materials. In this case, it is preferable that at least one of the two kinds of dielectric materials is STO, BST or PZT.

A memory cell according to the invention can be made lower than 5 V in both writing voltage and erasing voltage, and in this memory cell both write time and erase time become very short by comparison with conventional nonvolatile memory cells of analogous type. Furthermore, the endurance of the memory cell reaches to $10^7$ or $10^8$ write/erase cycles. That is, by comparison with the conventional memory cells the endurance is enhanced by a factor of $10^2$ or $10^3$.

In a memory cell according to the invention it is preferable that the control gate electrode covers the same area as the floating gate electrode. That is, the control gate electrode does not need to be made large in area, and the control gate and the floating gate can be similarly patterned. Accordingly the memory cell structure becomes simple and convenient for a reduction in the cell size, and therefore it is possible to enhance the density of integration of a flash EEPROM using memory cells of the invention. The invention will make a contribution to an expansion of uses of flash EEPROMs.

DESCRIPTION OF THE PREFERRED EMBODIMENTS

Figure 1:
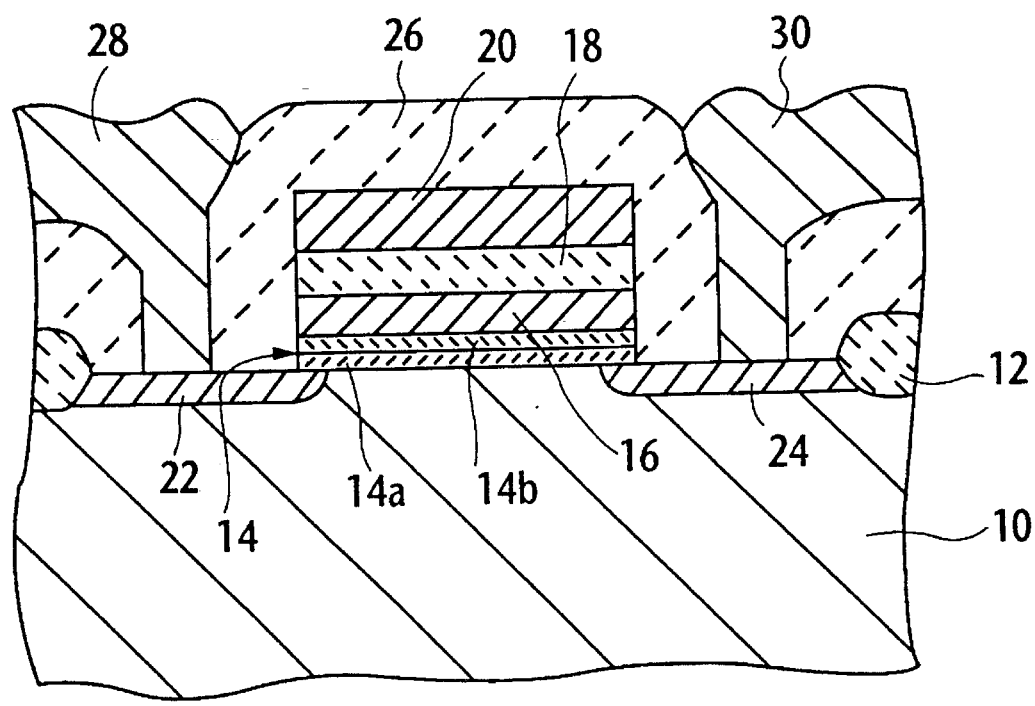
FIGS. 1 and 2 schematically show a floating-gate type memory cell according to the invention in two different sectional views.
Figure 2:
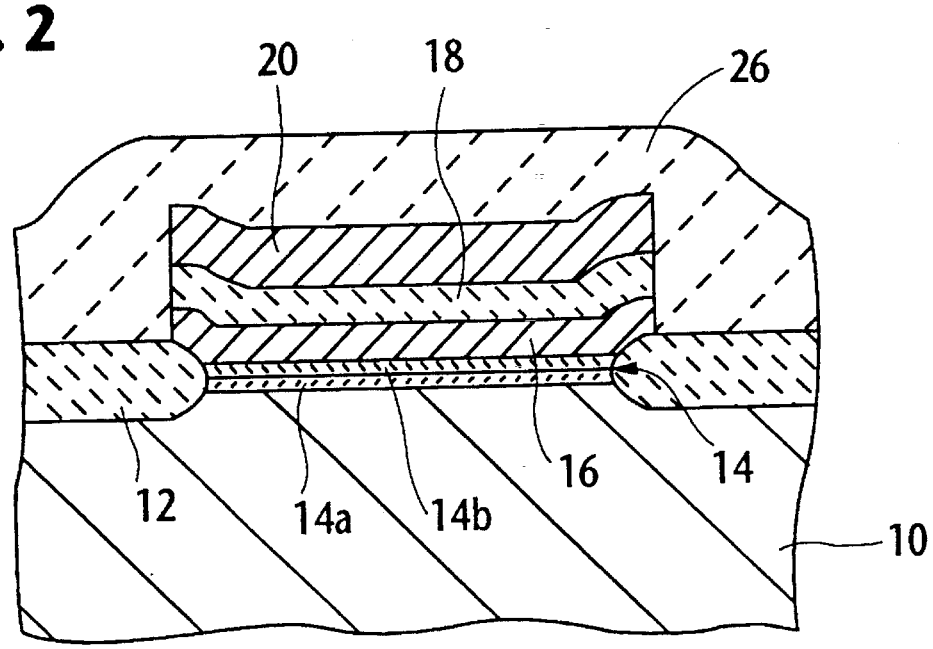

FIGS. 1 and 2 show the fundamental structure of a nonvoltatile memory cell embodying the invention. In principle the memory cell is a floating-gate type transistor. FIG. 1 shows a section taken along the length of the channel of the transistor and FIG. 2 another section which is transversal of the channel.

As an example, this transistor is an n-channel transistor using a p-type silicon substrate 10. A field oxide film 12 is formed on a principal surface of the substrate 10 for isolation of individual cells. In an active region where the field oxide film 12 is absent there is a gate dielectric film 14 on the principal surface of the silicon substrate 10. In this embodiment the gate dielectric film 14 has a two-layer structure consisting of a silicon nitride film 14a which is 0.51–1 nm thick and a silicon oxide film 14b which is 4–8 nm thick. The silicon nitride film 14a is formed by thermally nitriding the silicon substrate surface after removing natural oxide film from the substrate surface and cleaning the substrate surface. The surface of the silicon nitride film 14a is thermally oxidized, and the silicon oxide film 14b is formed on the film 14a.

The two-layer structure of the gate dielectric film 14 is merely an option. Alternatively, the gate dielectric film may be a monolayer film of silicon oxide, silicon nitride or silicon oxynitride.

A floating gate electrode 16 lies on the gate dielectric film 14. Basically the floating gate electrode 16 is a 50–100 nm thick polysilicon film doped with phosphorus or arsenic, and silicide of a high melting point metal such as tungsten or platinum silicide is deposited on the polysilicon film. Alternatively, ruthenium oxide or iridium oxide is deposited on the polysilicon film.

The floating gate 16 is overlaid with a dielectric film 18 which is high in relative permittivity and has a thickness of, for example, about 50 nm. In this embodiment the dielectric material of this film 18 is selected from STO, BST and PZT.

A control gate electrode 20 lies on the dielectric film 18. In this embodiment the control gate electrode 20 is about 200 nm thick and has a two-layer structure consisting of a base layer of ruthenium oxide or iridium oxide and a top layer of titanium nitride, palladium or platinum.

The source region 22 and drain region 24 of the transistor are $n_+$-type diffused layers which are formed, after forming the above described stacked gate structure, by implantation of arsenic ion and subsequent heat treatment by lamp annealing. It is important to employ a low-temperature heat treatment method since high-temperature heat treatment is liable to deteriorate the electrical characteristics of the inter-gate dielectric film 18 particularly in respect of dielectric strength.

The gate region and the source and drain regions are covered with an interlayer dielectric film 26 which is about 500 nm thick and is formed of either boro-phospho-silacate glass (BPSG) or silicon dioxide. A source electrode 28 and a drain electrode 30 are formed by using contact holes formed in the dielectric film 26.

Figure 3:
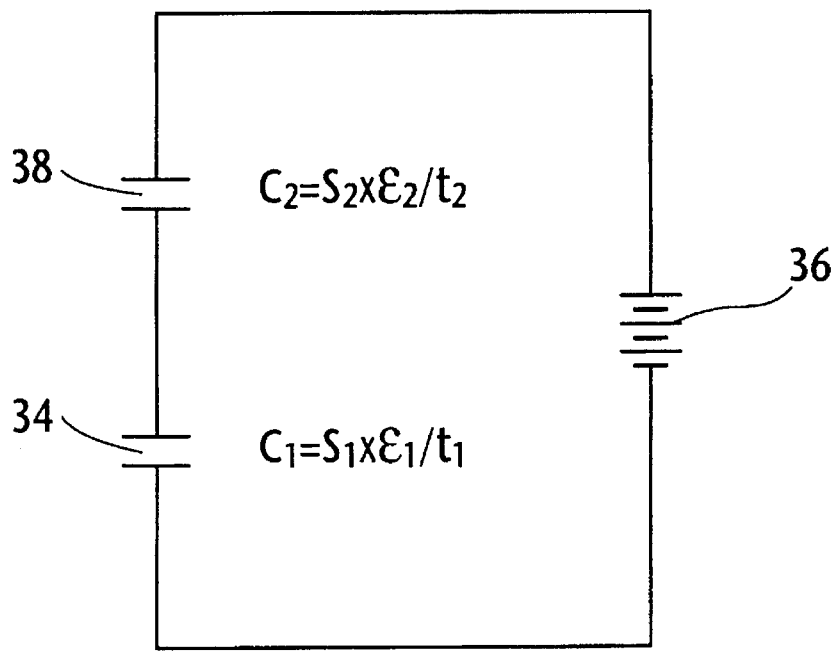
FIG. 3 is a circuit diagram showing an equivalent circuit of a principal part of the memory cell of FIGS. 1 and 2.

With respect to the stacked gate part of MIS (metal-insulator-semiconductor) structure in the transistor of FIGS. 1 and 2, an equivalent circuit is shown in FIG. 3. The gate dielectric film 14 provides a first gate capacitor 34, and the inter-gate dielectric film 18 provides a second gate capacitor 38. These two capacitors 34, 38 are connected in series with a power supply 36. The capacitance, $c_1$, of the first gate capacitor 34 is given by $s_1 \times \epsilon_1 / t_1$, where $s_1$ is the area of this capacitor 34, $\epsilon_1$ is the relative permittivity of the dielectric film 14 and $t_1$ is the thickness of the dielectric film 14. The capacitance, $c_2$, of the second gate capacitor 38 is given by $s_2 \times \epsilon_2 / t_2$, where $s_2$ is the area of this capacitor 38, $\epsilon_2$ is the relative permittivity of the dielectric film 18 and $t_2$ is the thickness of the dielectric film 18.

When a voltage $v_0$ is applied between the control gate electrode 20 and the silicon substrate 10, the initial voltage on the gate dielectric film 14 and the initial voltage on the inter-gate dielectric film 18 become $v_1$ and $v_2$, respectively. Then, in the equivalent circuit of FIG. 3 the voltage of the power supply 36 is $v_0$, and the voltage across the first gate capacitor 34 is $v_1$, and the voltage across the second gate capacitor 38 is $v_2$. The voltages $v_1$ and $v_2$ are given by the following equations (1) and (2), respectively.

$$v_1 = \frac{c_2}{c_1 + c_2} = \frac{1}{\frac{(t_2/t_1)}{(\epsilon_2/\epsilon_1)(s_2/s_1)} + 1} v_0 \quad (1)$$

$$v_2 = \frac{c_1}{c_1 + c_2} v_0 = \frac{1}{\frac{(t_1/t_2)}{(\epsilon_1/\epsilon_2)(s_1/s_2)} + 1} v_0 \quad (2)$$

For writing information into the memory cell of FIG. 1, a positive voltage is applied to the control gate 20 such that the field strength in the gate dielectric film 14 becomes about $5 \times 10^6$ V/cm. Then, writing of information charge is accomplished by injection of hot electrons appeared in the vicinity of the drain region 24 into the floating gate 18. The voltage $v_1$ of the equation (1) is given by the product of the thickness $t_1$ of the gate dielectric film 14 and the aforementioned field strength, and the voltage $v_1$ becomes nearly constant when the thickness of the dielectric film 14 is constant. Under this condition, equation (1) indicates that the writing voltage $v_0$ lowers when the relative permittivity $\epsilon_2$ of the intergate dielectric film 18 becomes higher.

For erasing the stored information charge, a negative voltage is applied to the control gate 20. Alternatively, the control gate 20 is kept at 0 V, and a positive voltage is applied to the source region 22 or the silicon substrate 10. In the erase operation the field strength in the dielectric film 14 is controlled to about $9\times10^6$ V/cm. The erasing voltage lowers when $\epsilon_2$ of the dielectric film 18 becomes higher.

Equation (2) indicates that the voltage $v_2$ lowers when $\epsilon_2$ of the dielectric film 18 becomes higher. Lowering of the voltage $v_2$ has the effect of decreasing the flow of electrons through the dielectric film 18 in the writing and erasing operations. Therefore, in selecting a dielectric material that is high in relative permittivity for the dielectric film 18 it is permissible to sacrifice the dielectric strength of the film 18 to some extent.

In the memory cell of FIGS. 1 and 2, the control gate 20 and the floating gate 16 have the same area. That is, $s_1$ and $s_2$ in the equations (1) and (2) take the same value. This is favorable for reducing the memory cell size.

Using the equation (1) an outline of the conditions required for lowering of the writing and erasing voltages can be determined. For retaining the stored information charge for more than $10^5$ hours, the minimum thickness of silicon oxide film formed as the gate dielectric film is 5 nm. So, when an electric field of $5\times10^6$ V/cm is applied to the gate dielectric film 14 the minimum value of the voltage $v_1$ becomes 2.5 V. If it is desired that the voltage $v_0$ to be applied to the control gate 20 is not higher than 5 V it is necessary that $v_1/v_2$ is not smaller than 0.5. From equation (1) it is seen that the relation $v_1/v_0 \geq \frac{1}{2}$ holds when the relation $t_2/t_{1 \leq \epsilon_2/\epsilon_1}$ holds.

Figure 4:
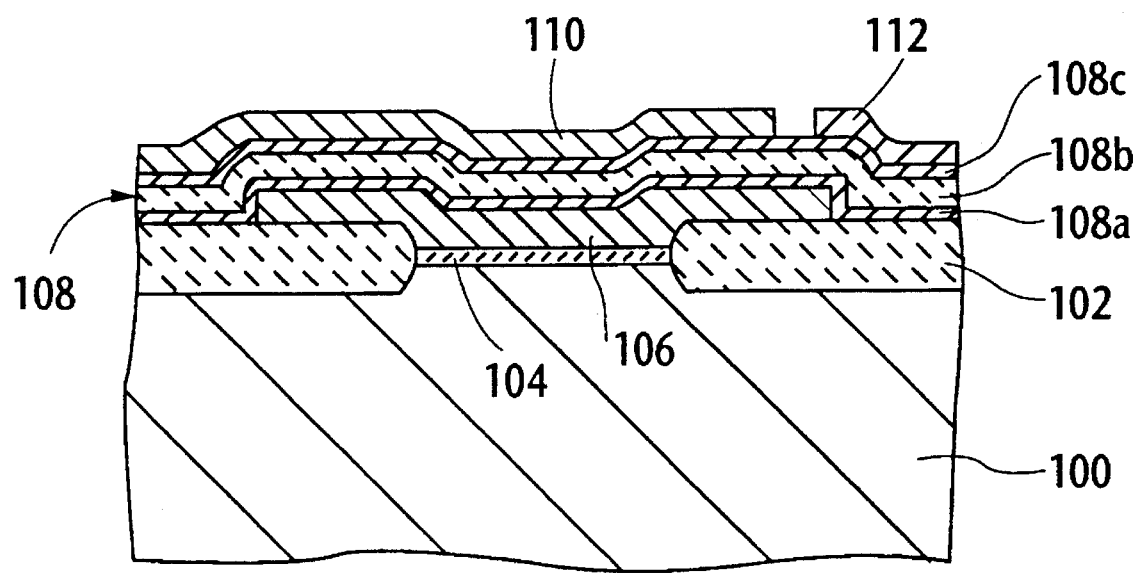
FIG. 4 is a schematic sectional view of a known nonvolatile memory cell.

For comparison, FIG. 4 shows the structure of the known nonvolatile memory cell mentioned in the Background section. The memory cell, which is a floating-gate type transistor, is shown in a section transversal of the channel of the transistor. On a p-type silicon substrate 100 a field oxide film 102 is formed. A gate dielectric film 104 of silicon oxide is formed over the channel region of the transistor, and a floating gate electrode 106 of polysilicon is formed so as to cover the dielectric film 104. The floating gate 106 is covered by a dielectric film 108 which has a three-layer structure consisting of a silicon oxide film 108a, a silicon nitride film 108b and a silicon oxynitride film 108c. On this dielectric film 108 there is a control gate electrode 110 of polysilicon which overlaps a major area of the floating gate electrode 106. In addition, an injection-erase gate electrode 112 of polysilicon is formed on the dielectric film 108 so as to overlap only an end area of the floating gate electrode 106.

In the writing operation of this memory cell, the injection-erase gate 112 is kept at 0 V and a positive voltage is applied to the control gate 110 to inject electrons from the injection-erase gate 112 into the floating gate 106. In the erasing operation the control gate 110 is kept at 0 V and a positive voltage is applied to the injection-erase gate 112 to eject electrons from the floating gate to the injection-erase gate 112.

The injection-erase gate 112 overlaps the floating gate 106 in a very small area, but the control gate 110 overlaps the floating gate 106 in a relatively large area. This is for the purpose of lowering the writing and erasing voltages. The reason is as follows.

When a voltage $V_{GD}$ is applied between the control gate 120 and the injection-erase gate 112 for writing or erasing, a voltage V between the floating gate 106 and the injection-erase gate 112 is given by the following equation (3).

$$V = \frac{C_2}{C_1 + C_2} V_{GD} = \frac{1}{1 + S_1/S_2} V_{GD} \quad (3)$$

where $C_1$ is the capacitance between the floating gate 106 and the injection-erase gate 112, $C_2$ is the capacitance between the floating gate and the control gate 120, $S_1$ is the overlapping area of the floating gate 106 and the injection-erase gate 112, and $S_2$ is the overlapping area of the floating gate and the control gate 120.

On the premise that the voltage V is to be constant, equation (3) indicates that the writing or erasing voltage $V_{GD}$ can be lowered by making the area $S_2$ larger than the area $S_1$. Assuming that in the writing and erasing operations the field strength in the dielectric film 108 between the floating gate 106 and the injection-erase gate 112 is $5\times10^6$ V/cm, it is desirable that the field strength in the film 108 between the floating gate and the control gate 110 becomes below $1\times10^6$ V/cm with a view to preventing the flow of a current between the floating gate 106 and the control gate 110. To meet this desire, the area $S_2$ must be made more than 5 times larger than the area $S_1$.

Several samples of the memory cell of FIG. 1 were produced by alternately using tantalum oxide, STO, BST and PZT as the material of the inter-gate dielectric film 18. In every case the thickness $t_1$ of the gate dielectric film 14 was 5 nm, and the thickness $t_2$ of the inter-gate dielectric film 18 was 50 nm. The relative permittivity $\epsilon_1$ of the gate dielectric film 14 was 4. The writing and erasing characteristics of the memory cell samples were as shown in the following Table. In the test operations the reference voltage for reading was 1 V, and $\Delta V$ of the following equation (4) was 2 V. For reading logical "1" or "0" of stored information, it is necessary to keep $\Delta V$ at a constant value.

$$\Delta V = qN/c_2 = qt_2N/\epsilon_2 \quad (4)$$

where q is the elementary electric charge, and N is the number of electrons injected into the floating gate per unit area.

| Material of Inter-gate Dielectric Film | $Ta_2O_5$ | STO | BST | PZT |
| --- | --- | --- | --- | --- |
| Relative Permittivity $\epsilon_2$ | 24 | 200 | 510 | 805 |
| Writing Voltage (V) | 6.5 | 3.0 | 2.7 | 2.5 |
| Write Time ($\mu$s) | 0.5 | 1.0 | 1.5 | 1.5 |
| Erasing Voltage (V) | 10 | 3.5 | 3.0 | 2.7 |
| Erase Time ($\mu$s) | 1 | 5 | 7 | 10 |
| Endurance (write-erase cycles) | $10^6$ | $10^7$ | $10^7$ | $10^8$ |

As can be seen in the Table, both writing voltage and erasing voltage become lower than 5 V when the inter-gate dielectric film 18 is formed of STO, BST or PZT so that the permittivity ratio $\epsilon_2/\epsilon_1$ is sufficiently high. Also it is seen that the endurance of the memory cell reaches $10^7$ or $10^8$ write/erase cycles which are very greater than $10^5$ cycles of conventional memory cells of analogous type. Besides, both write time and erase time become very short. In the conventional memory cells write time is about 10$\mu$s, and erase time is about 1 ms. As to the retention of stored information, there is not a significant difference in retention time between the invention and the conventional memory cells. The retention time is of the order of $10^5$ hours, i.e. more than 10 years, and this is sufficient for practical use of nonvolatime memory cells.

Figure 5:
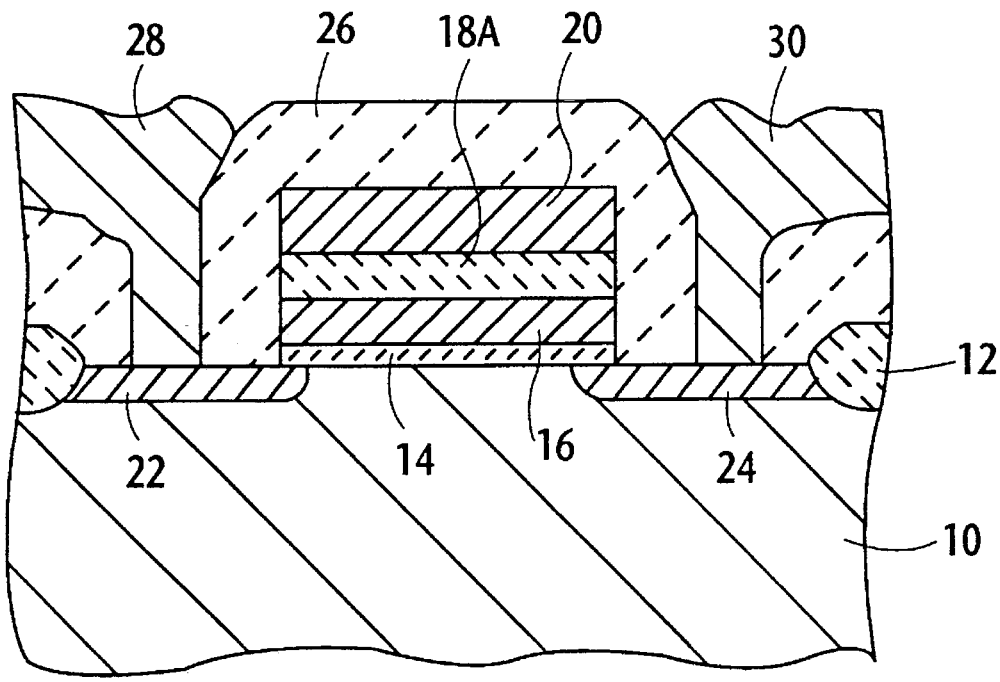
FIGS. 5 and 6 show two different modifications of the memory cell of FIG. 1, respectively.

FIG. 5 shows another embodiment of the invention. The memory cell of FIG. 5 is similar to the memory cell of FIG. 1 in the fundamental structure. As a minor modification, the gate dielectric film 14 in FIG. 5 is a monolayer film of silicon oxynitride having a thickness of 5 nm. As an important modification, the inter-gate dielectric film 18A in the memory cell of FIG. 5 has a gradient of chemical composition in the thickness direction, whereas the inter-gate dielectric film 18 in FIG. 1 is a homogenous film. More definitely, the dielectric film 18A is formed of a solid solution of two kinds of metal oxides, and the proportions of two metal oxides vary continuously of stepwise from the bottom plane adjacent to the floating gate 16 to the top plane. As a preferred example, the dielectric film 18A is formed of a solid solution of barium titanate and strontium titanate, i.e. barium strontium titanate.

The $(Ba, Sr)TiO_3$ film 18A of varying composition can be formed by either a CVD (chemical vapor deposition) process or a sputtering process. An example of the CVD process is as follows.

A low-pressure CVD apparatus is used. After depositing a polysilicon film to be patterned into the floating gate electrode 16, the substrate is placed in a quartz reaction tube which can be evacuated, and the reaction tube is kept at a temperature of 600°–700° C. by external heating. As the source of Ti, titanium tetraisopropoxide $Ti(i-OC_3H_7)_4$ is used. This material is a gas at normal temperature. The source of Sr is a powder of $Sr(DPM)_2$, where DPM represents dipivaloylmethyl group $—CH(CO—C(CH_3)_3)_2$. This material is sublimated in a stainless steel vessel by heating at about 190° C. The source of Ba is a powder of $Ba(DPM)_2$. This material is sublimated in a stainless steel vessel by heating at about 210° C.

These reactant gases are individually introduced into a mixing cylinder of stainless steel by using argon gas as carrier gas. The gas feed pipes are kept heated at about 220° C to prevent condensation of the reactant gases. The mixing cylinder is kept heated at about 230° C. In addition to the reactant gases, oxygen gas or nitrous oxide gas is fed into the mixing cylinder. The gas feed pipes are made as short as possible. The mixed reaction gas is introduced into the reaction tube. The total pressure of the reaction gas is constantly kept at about 1 Torr. The flow rate of $Ti(i-OC_3H_7)_4$ gas is kept constant, but the flow rate of $Sr(DPM)_2$ gas and the flow rate of $Ba(DPM)_2$ gas are correlatively varied while the deposition proceeds. For example, $Ti(i-OC_3H_7)_4$ gas is supplied at a constant flow rate of 70 sccm, and the flow rate of $Sr(DPM)_2$ is gradually increased from 0 sccm at the start of the CVD operation to 300 sccm at the end of the operation while the flow rate of $Ba(DPM)_2$ is gradually decreased from 70 sccm at the start to 0 sccm at the end. In this case the film deposition rate is about 1 nm/min, and the operation is continued until the thickness of the deposited film reaches 50 nm. In the deposited film 18A the chemical composition varies in the thickness direction from barium titanate in the bottom plane to barium strontium titanate and finally to strontium titanate in the top plane. When the flow rates of the Ba and Sr source gases are continuously varied the proportion of Sr to Ba in the film varies continuously, and the amount of the variation in the film depends on the extent of variations in the gas flow rates. When the gas flow rates are varied intermittently the proportion of Sr to Ba in the deposited film varies stepwise.

In barium titanate the forbidden band width is about 3.0 eV, and in strontium titanate that is about 3.4 eV. Therefore, in the band structure of the inter-gate dielectric film 18A of compositions varying from barium titanate to strontium titanate, there is a gradient of conduction band to make an about 0.4 eV difference. For this reason the electrons injected from the conduction band of the silicon substrate into the floating gate 16 and stored therein hardly flow into the control gate 20. Therefore, in the memory cell of FIG. 5 the information charge retention time is about twice that in the memory cell of FIG. 1 with the inter-gate dielectric film 18 of homogeneous barium strontium titanate. Besides, in the writing operation the injection of electrons into the gate dielectric film 14 is suppressed by an internal electric field that corresponds to the gradient of the conduction band, and therefore the erase time shortens to ⅕ of that in the memory cell having the dielectric film 18 of homogeneous barium strontium titanate.

Figure 6:
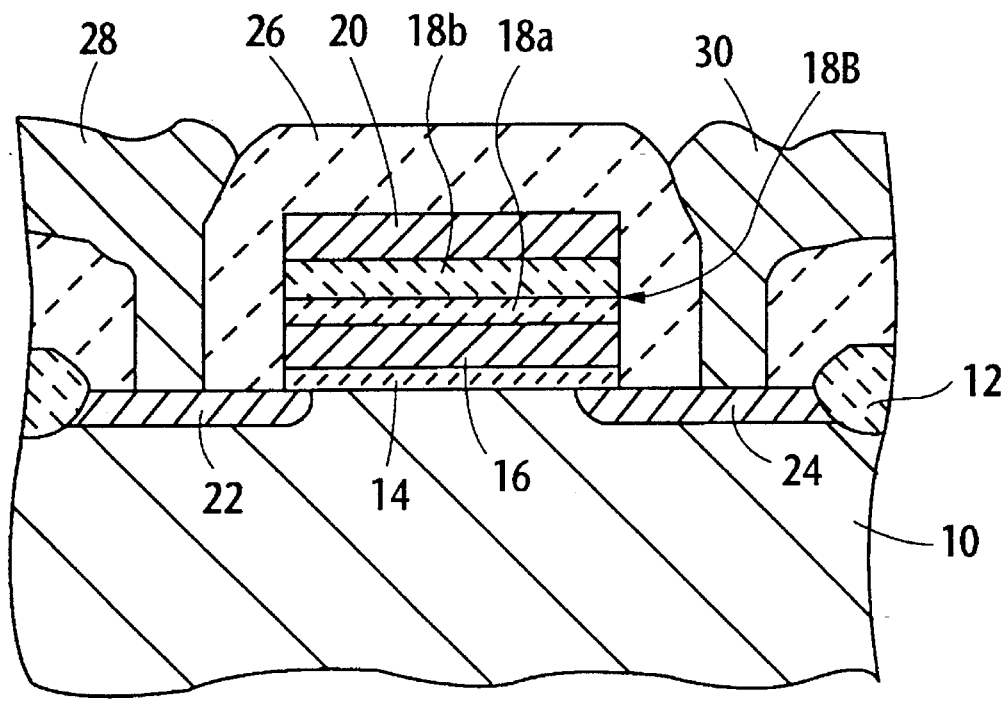

FIG. 6 shows a third embodiment of the invention. In the fundamental structure this embodiment is similar to the memory cell of FIG. 1. However, in this memory cell the inter-gate dielectric film 18B has a two-layer structure consisting of a bottom layer 18a of a first dielectric material and a top layer 18b of a second dielectric material. The two dielectric materials are selected such that the relative permittivity $\epsilon_2$ of the laminer film 18B as a whole is appropriately greater than that, $\epsilon_1$, of the gate dielectric film 14. It is preferable that the forbidden band in the bottom layer 18a is wider than that in the top layer 18b.

For example, the bottom layer 18a is a 10 nm thick tantalum oxide film and the top layer 18b is a 40 nm thick BST film. The relative permittivity $\epsilon_2$ of the laminated dielectric film 18B (50 nm thick) is about 100. Since $\epsilon_1$ of the gate dielectric film 14 is 4, in this case $\epsilon_2/\epsilon_1$ is about 25. The tantalum oxide film 18a can be formed, for example, by a low-pressure CVD process using $Ta(OC_2H_5)_5$ gas and oxygen gas as reactants or a plasma CVD process using $TaCl_5$ gas and $N_2O$ gas. The BST film 18b can be formed by the CVD process described with respect to the second embodiment, maintaining the flow rates of the reactant gases constant. Compared with the memory cell of FIG. 1 with the monolayer inter-gate dielectric film 18 of BST, the memory cell of this example is about ½ in write time, about ⅕ in erase time and more than twofold in stored information retention time. This memory cell becomes slightly higher in writing voltage and erasing voltage, but the both voltages are still lower than 4 V.

Another example of the laminated dielectric film 18B is the combination of a 10 nm thick tantalum oxide film as the bottom layer 18a and a 50 nm thick STO film as the top layer 18b. In this case the laminated film 18B (60 nm thick) as a whole has a relative permittivity $\epsilon_2$ of about 75. A still different example is a laminate of a 5 nm thick silicon nitride film as the bottom layer 18a and a 45 nm thick STO film as the top layer 18b. In this case $\epsilon_2$ of the whole of the laminated film 18B (50 nm) is about 53.

The two-layer dielectric film 18B in FIG. 6 may be further modified into a multilayer film consisting of more than two layers. For example, a three-layer structure of $Ta_2O_5/BST/Ta_2O_5$ or STO/BST/STO may be employed.

The following is a detailed description of a typical process of fabricating a memory cell according to the invention having the laminated dielectric film 18B of FIG. 6. FIGS. 7(A) to 7(D) illustrate several steps of the process in sections taken along the length of the channel of the transistor and FIGS. 8(A) to 8(C) in sections transversal of the channel.

Figure 7A:
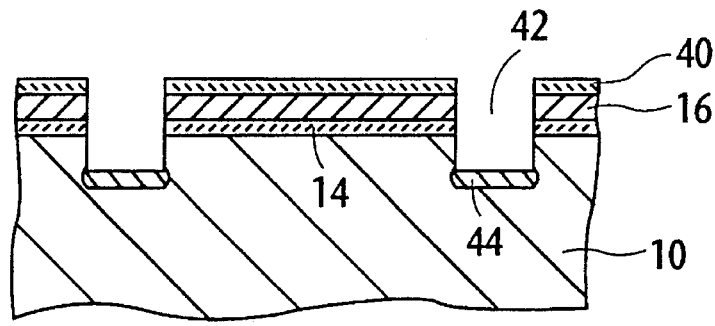
FIGS. 7(A) to 7(D) illustrate a process of fabricating a memory cell according to the invention in schematic sectional views.
Figure 8A:
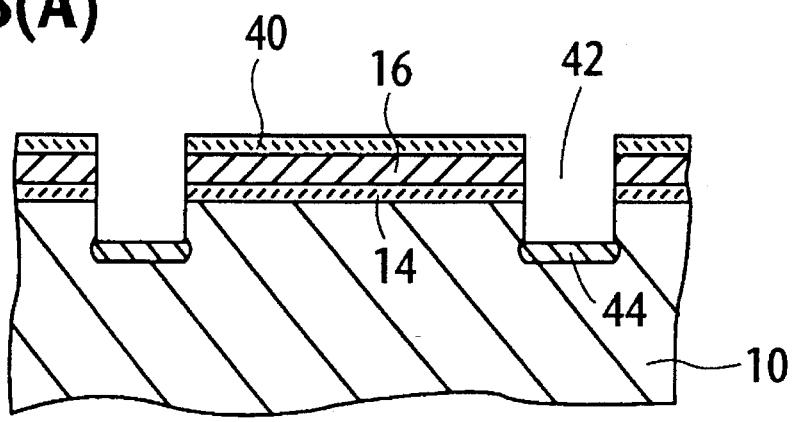
FIGS. 8(A) to 8(C) illustrate the same process in different sectional views.

Referring to FIGS. 7(A) and 8(A), a silicon oxide film (14) having a thickness of 5–8 nm is formed on a principal surface of a p-type silicon substrate 10 by thermal oxidation of the substrate surface. Then the silicon oxide film is thermally nitrided to turn into a silicon oxynitride film 14. As an alternative, a two-layer dielectric film may be formed by first depositing a 0.5–1 nm thick silicon nitride film on the substrate surface and overlaying the silicon nitride film with a 4–8 nm thick silicon oxide film.

Next, a polysilicon film 16, which is doped with phosphorus, is deposited on the dielectric film 14 to a thickness of 40 nm, and the polysilicon film 16 is overlaid with a mask oxide film 40. The mask oxide film 40 is removed in regions to become field regions for isolation of individual cells. Using the remaining oxide film 40 as mask, the polysilicon film 16, dielectric film 14 and the silicon substrate 10 are continuously etched by dry etching to form trenches 42. Then channel stopper regions 44 are formed below the bottom of the trenches 42 by boron ion implantation.

Figure 7B:
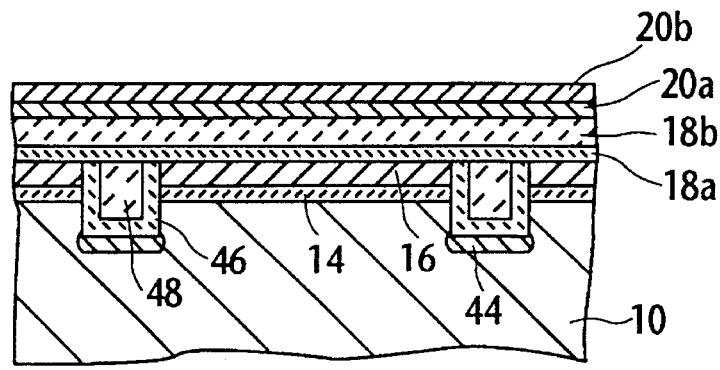
Figure 8B:
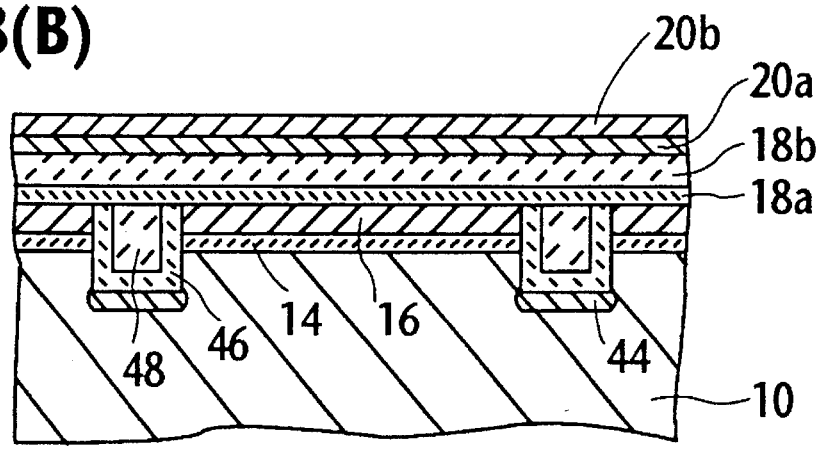

Referring to FIGS. 7(B) and 8(B), an oxide film 46 is deposited on the bottom and inner sidewalls of the tranches 42, and then the trenches are filled with silicon oxide 48. After that the mask oxide film 40 is removed, and a STO film 18a having a thickness of about 10 nm is formed on the polysilicon film 16 and the oxide 46, 48 filling the trenches 42. The STO film 18a is deposited by a sputtering method using a STO target and a mixture of argon gas and oxygen gas as sputtering gas. For example, the film deposition rate is about 2 nm/min. Then, a BST film 18b having a thickness of about 40 nm is formed on the STO film 18a by a sputtering method using a BST target and the aforementioned sputtering gas. Next, a 10 nm thick ruthenium oxide film 20a is deposited on the BST film 18b by sputtering, and a 100 nm thick tungsten film 20b on the ruthenium oxide film 20a by sputtering.

Figure 7C:
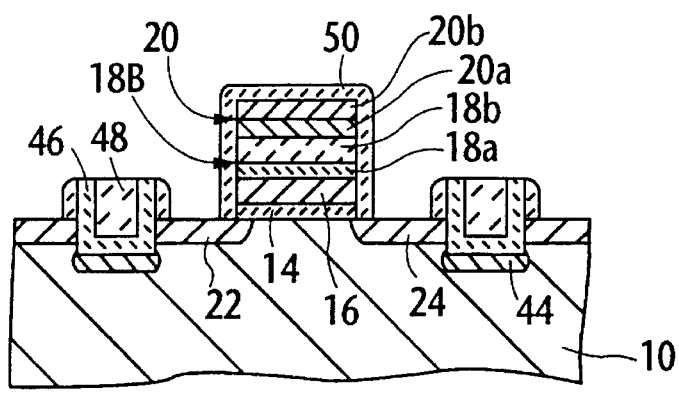

Referring to FIG. 7(C), patterning of the films on the substrate is performed by successive dry etching operations to etch the tungsten film 20b, ruthenium oxide film 20a, BST film 18b, STO film 18a, polysilicon film 16 and dielectric film 14 in turn in order to form a gate structure. The polysilicon film 16 provides a floating gate electrode. The laminate of the STO film 18a and the BST film 18b provides an inter-gate dielectric film 18B. The laminate of the tungsten oxide film 20a and the tungsten film 20b provides a control gate electrode 20. After that, a coating insulator film 50 is formed so as to entirely cover the gate structure. This insulator film 50 is a laminate of a 10–20 nm thick silicon oxide film and a 20–50 nm thick silicon nitride film.

Next, as source and drain regions of an n-channel transistor, n⁺-type diffused layers 22 and 24 are formed in the substrate 10 by arsenic ion implantation and subsequent heat treatment. At the heat treatment, the coating insulator film 50 serves the purpose of preventing contamination with metal ions issuing from the floating gate electrode 16, inter-gate dielectric film 18B and/or the control gate electrode 20 and, besides, protecting the gate dielectric film 14 and the intergate dielectric film 18B from deterioration by heat.

Figure 7D:
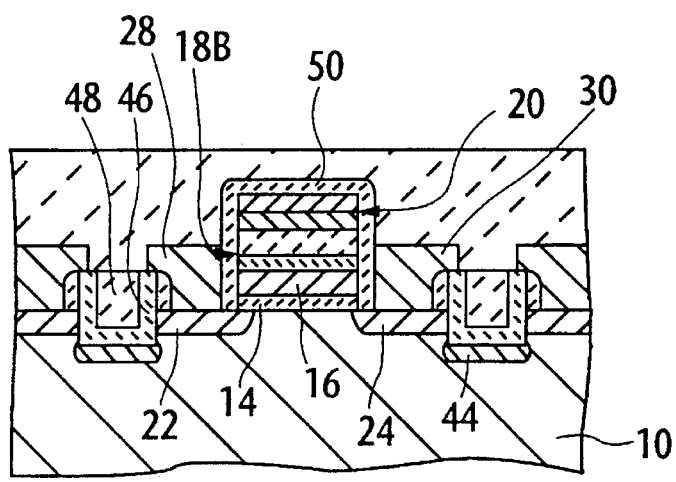
Figure 8C:
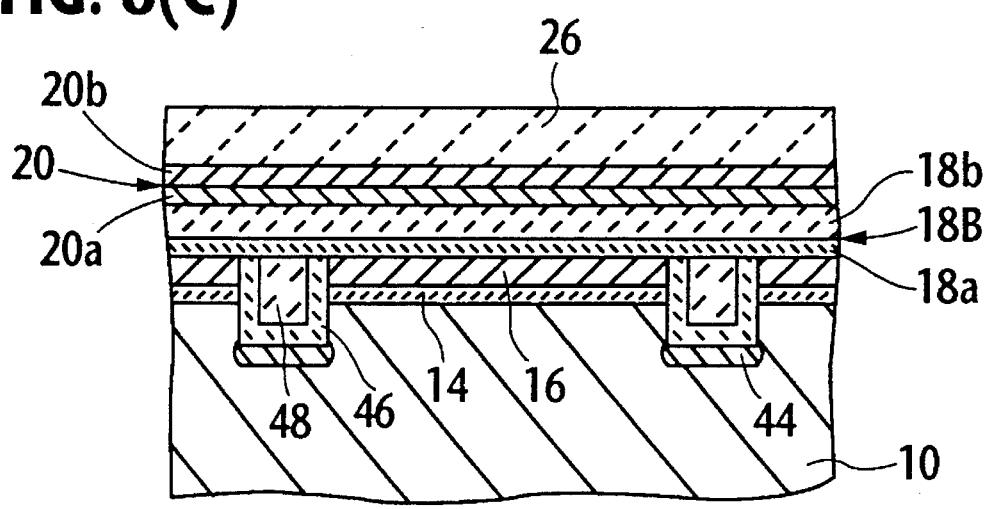

After that, as shown in FIG. 7(D), a source electrode 28 and a drain electrode 30 are formed, and then an interlayer dielectric film 26 is formed. As can be seen in FIG. 8(C), in the direction transversal of the channel of the transistor in the memory cell both the control gate electrode 20 and the inter-gate dielectric film 18B extend across the borders of the memory cell so that a memory cell array of EEPROM can be constructed. In each individual memory cell the floating gate 16 and the control gate 20 have the same area.

What is claimed is:

1. In a semiconductor nonvolatile memory cell having a first dielectric film on a semiconductor substrate, a floating gate electrode which lies on the first dielectric film, a second dielectric film which lies on the floating gate electrode and a control gate electrode which lies on the second dielectric film, the improvement comprising said first and second dielectric films being formed such that the relations (a) and (b) hold:

$$\epsilon_2/\epsilon_1 \geq 13 \tag{a}$$

$$t_2/t_1 \leq \epsilon_2/\epsilon_1 \tag{b}$$

where $\epsilon_1$ is the relative permittivity of the first dielectric film, $\epsilon_2$ is the relative permittivity of the second dielectric film, $t_1$ is the thickness of the first dielectric film and $t_2$ is the thickness of the second dielectric film.

2. A memory cell according to claim 1, wherein the permittivity ratio $\epsilon_2/\epsilon_1$ is higher than 20.

3. A memory cell according to claim 1, wherein the control gate electrode covers the same area as the floating gate electrode.

4. A memory cell according to claim 1, wherein the second dielectric film is formed of a compound oxide selected from the group consisting of strontium titanate, barium strontium titanate and lead zirconate-titanate.

5. A memory cell according to claim 1, wherein the second dielectric film is formed of a solid solution of two kinds of metal oxides such that the proportions of the two kinds of metal oxides in the solid solution vary in the direction of the thickness of the film.

6. A memory cell according to claim 5, wherein said proportions vary continuously.

7. A memory cell according to claim 5, wherein said proportions vary stepwise.

8. A memory cell according to claim 5, wherein said two kinds of metal oxides are barium titanate and strontium titanate.

9. A memory cell according to claim 1, wherein the second dielectric film is a laminate comprising at least one layer of a dielectric material and at least one layer of another dielectric material.

10. A memory cell according to claim 9, wherein the second dielectric film comprises, a tantalum oxide layer and a strontium titanate layer.

11. A memory cell according to claim 9, wherein the second dielectric film comprises a tantalum oxide layer and a barium strontium titanate layer.

12. A memory cell according to claim 9, wherein the second dielectric film comprises a strontium titanate layer and a barium strontium titanate layer.

13. A memory cell according to claim 1, wherein the material of the first dielectric film is selected from the group consisting of silicon oxide, silicon nitride and silicon oxynitride.

* * * * *